US011114819B2

(12) United States Patent
Kaikkonen et al.

(10) Patent No.: US 11,114,819 B2
(45) Date of Patent: Sep. 7, 2021

(54) LASER CARRIER-ON-CHIP DEVICE

(71) Applicant: Finisar Sweden AB, Järfälla (SE)

(72) Inventors: Andrei Kaikkonen, Jäfrälla (SE);
Lukasz Kumanowski, Norrtälje (SE);
Nicolae Chitica, Kista (SE); David Adams, Stockholm (SE)

(73) Assignee: FINISAR SWEDEN AB, Jarfalla (SE)

( * ) Notice: Subject to any disclaimer, the term of this patent is extended or adjusted under 35 U.S.C. 154(b) by 84 days.

(21) Appl. No.: 16/555,363

(22) Filed: Aug. 29, 2019

(65) Prior Publication Data

US 2020/0076157 A1 Mar. 5, 2020

Related U.S. Application Data

(60) Provisional application No. 62/724,679, filed on Aug. 30, 2018.

(51) Int. Cl.
*H01S 5/042* (2006.01)

(52) U.S. Cl.
CPC ................. *H01S 5/0427* (2013.01)

(58) Field of Classification Search
CPC ....... H01S 5/0427; H01L 27/02; H01L 23/00; H01L 21/52
USPC ......................... 372/38.02; 361/766; 257/621
See application file for complete search history.

(56) References Cited

U.S. PATENT DOCUMENTS

| | | | | |
|---|---|---|---|---|
| 5,982,793 A | * | 11/1999 | Kobayashi | H01S 5/0427 372/38.1 |
| 9,007,672 B2 | | 4/2015 | Han et al. | |
| 10,141,271 B1 | * | 11/2018 | Xu | H01L 21/48 |
| 2016/0134974 A1 | * | 5/2016 | Salmon | H04R 19/04 381/174 |

FOREIGN PATENT DOCUMENTS

| | | | | |
|---|---|---|---|---|
| JP | H05110201 | * | 4/1993 | ............... H01S 3/18 |
| JP | H05110201 A | | 4/1993 | |
| JP | 2016181543 A | | 10/2016 | |

OTHER PUBLICATIONS

International Search Report and Written Opinion as in PCT/EP2019/072864, dated Nov. 19, 2019.

* cited by examiner

*Primary Examiner* — Tuan N Nguyen
(74) *Attorney, Agent, or Firm* — Blank Rome LLP

(57) ABSTRACT

A semiconductor laser chip-on-carrier (CoC) device comprising:
a semiconductor laser component comprising an electric laser terminal;
a driver circuit for producing on an electric driver terminal an alternating current electric driving signal; and
an electric signal conductor electrically connecting the driver terminal to the laser terminal, wherein the electric signal conductor comprises:
a first printed trace which is not arranged on the semiconductor laser component and which comprises a first trace elongated section and a first trace downstream terminal section; and
a first wire bond, connecting the first trace downstream terminal section to the laser terminal, and
wherein the first trace elongated section is adapted to the semiconductor laser component such that the first trace elongated section and an internal capacitance of the semiconductor is laser component together correspond to an impedance which is at the most 20% from an output impedance of an output terminal of the driver circuit.

16 Claims, 3 Drawing Sheets

LASER CARRIER-ON-CHIP DEVICE

CROSS-REFERENCE TO RELATED APPLICATION

This patent application claims the benefit of and priority to U.S. Provisional App. No. 62/724,679 filed Aug. 30, 2018. The 62/724,679 application is incorporated herein by reference.

FIELD

Some embodiments relate to a semiconductor laser chip-on-carrier (CoC) device. In such a device, a semiconductor laser component chip is arranged on a specific carrier, in turn being connected to or supported by an integrated circuit board.

In particular, some embodiments are applicable to laser datacom communication devices in which the semiconductor laser is an EML (Electro-absorption Modulated Laser), DML (Directly Modulated Laser) or DFB-MZM (Distributed Feedback Laser which is modulated using a Mach Zehnder Modulator), and where this semiconductor laser component is arranged in the form of a chip in turn mounted on a carrier, forming a CoC design. Telecom applications may be possible. For simplicity, some embodiments described herein are described within the context of datacom applications.

BACKGROUND

In datacom transmitter devices comprising a CoC device, a driver circuit, such as a driver circuit arranged on a PCB (Printed Circuit Board) module, is arranged to provide a driving electric signal on an output driver signal terminal. This terminal is then connected to the semiconductor laser component via a signal conductor, such as via the CoC device carrier material on which the laser component is installed. The carrier may comprise an additional set of conductors, propagating the provided electric signal to the laser component. In addition to a signal lead, one or several ground conductors will typically also be used for the return signal.

The signal conductor will typically comprise PCB RF trace conductors, such as comprised in the driver circuit, the PCB module, the carrier and the laser chip itself. Such RF trace conductors are then connected via wire bonds between these subcomponents.

It is desirable for the electric signal received by the laser component to be as little distorted as possible. This can, for instance, be achieved using conductors of relatively short length. In particular, it has proven difficult to make said interconnecting wire bonds short enough due to geometric consideration and limitations. Possible solutions presented to date for shortening the connectors comprise finding alternative laser component arrangements on the carrier surface, or connecting the wire bonds to oversized metal connection points. Such solutions drive both production costs and device complexity.

Hence, it would be desirable to be able to achieve an electric signal reaching the laser component with as little distortion as possible, while simultaneously not significantly increasing manufacturing cost or device complexity.

SUMMARY

Some embodiments described herein solve the above and/or other problem(s).

Hence, embodiments described herein relate to a semiconductor laser chip-on-carrier (CoC) device comprising a semiconductor laser component arranged in the form of a laser chip mounted on a semiconductor carrier, the semiconductor laser component comprising an electric laser terminal; a driver circuit for producing on an electric driver terminal an alternating current electric driving signal; and an electric signal conductor electrically connecting the driver terminal to the laser terminal, wherein the electric signal conductor comprises a first printed trace, which first printed trace is not arranged on the laser component and which first printed trace comprises a first trace elongated section and a first trace downstream terminal section; and a first wire bond, connecting the first trace downstream terminal section to the laser terminal, and wherein the first trace elongated section is adapted to the laser component such that the first trace elongated section and an internal capacitance of the laser component together correspond to an impedance which is at the most 20% from an output impedance of an output terminal of the driver circuit.

BRIEF DESCRIPTION OF THE DRAWINGS

In the following, the invention will be described in detail, with reference to exemplifying embodiments of the invention and to the enclosed drawings, wherein:

In FIGS. 1-3, corresponding parts share the two last reference numeral digits.

DETAILED DESCRIPTION OF SOME EXAMPLE EMBODIMENTS

Figure 1:
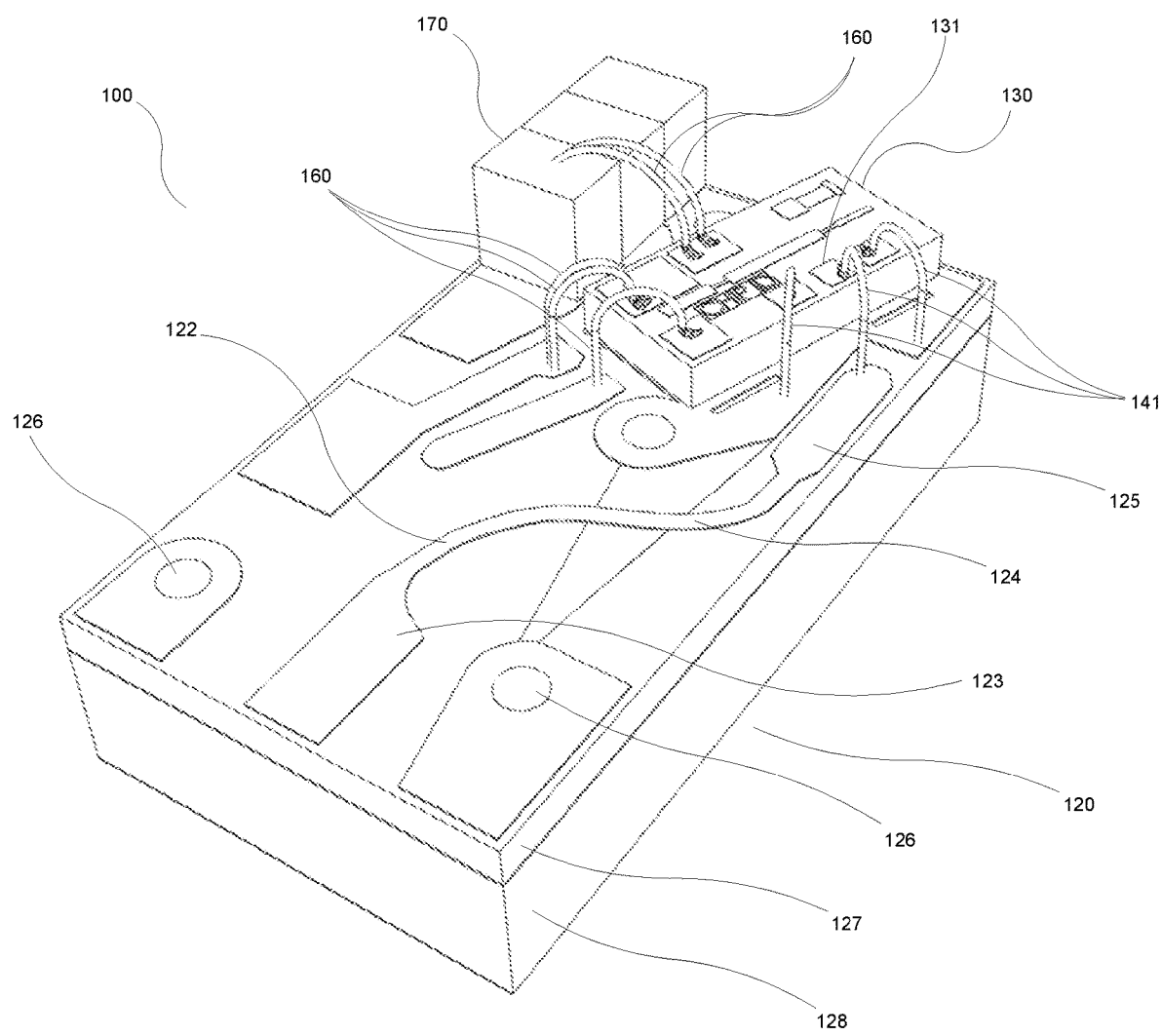
FIG. 1 is a perspective view of an exemplifying first embodiment.

Hence, FIG. 1 illustrates a part of a semiconductor chip-on-carrier (CoC) device 100 according to a first embodiment. A CoC device is typically one in which a semiconductor chip, such as a semiconductor laser component 130, is mounted on a semiconductor carrier 120, manufactured from a carrier material 127, such as a semiconductor material supported on a substrate 128. CoC device designs are as such well-known in the art, and will not be described in further detail herein.

The semiconductor CoC device 100 hence comprises said semiconductor laser component 130, which is arranged in the form of a laser chip mounted on said semiconductor carrier 120. The semiconductor laser component 130 comprises an electric laser terminal 131 for electric control of the laser 130 operation via an electric control signal delivered on said terminal 131.

In addition to the laser component 130, the semiconductor carrier 120 may also comprise and/or support other component parts, such as a decoupling capacitor 170, a photodetector (not shown), a temperature control component (not shown), and so on.

Figure 2:
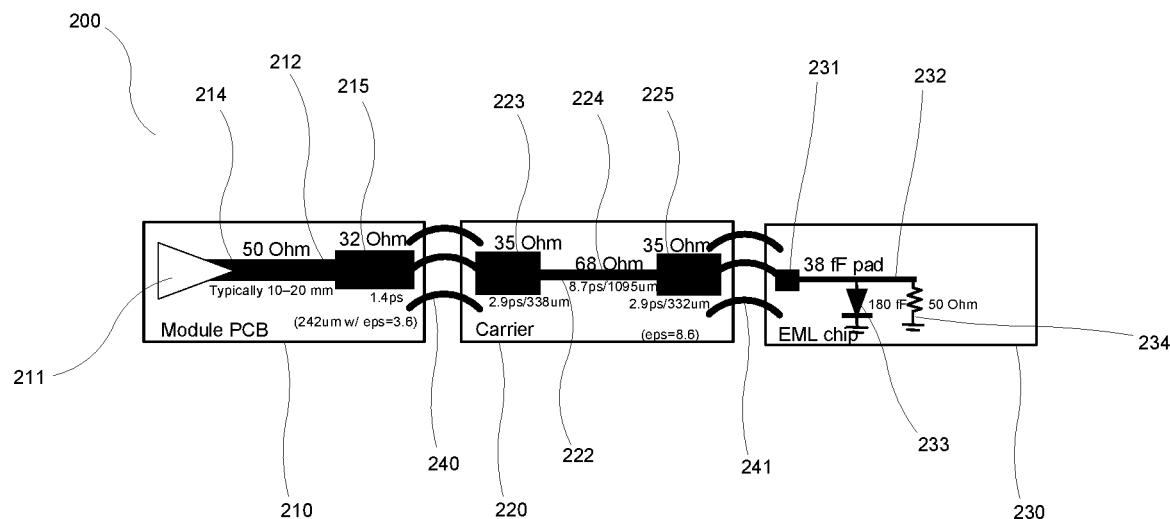
FIG. 2 is a schematic view of an exemplifying second embodiment.

Turning to FIG. 2, the semiconductor CoC device 100 furthermore comprises a driver circuit 210 having an electric driver terminal 211. A driver of the driver circuit 210 is arranged to produce on said electric driver terminal 211 an alternating current electric driving signal.

Furthermore, and is illustrated in FIGS. 1 and 2, the semiconductor CoC device 100 comprises an electric signal conductor 212, 122, 222, 132, 232, arranged to electrically connect the driver terminal 211 to the laser terminal 131, 231. In other words, the electric signal produced by the driver circuit 210 is propagated along the electric signal conductor 212, 122, 222, 132, 232 to the laser terminal 131, 231 for modulation control of the laser 130.

The driver circuit 210 may comprise additional components, such as an equalizing signal processor, which is conventional as such.

In particular, the electric signal conductor comprises a first printed trace conductor 122, 222, which first printed trace 122, 222 is not arranged on the laser component 130, 230. Rather, as is illustrated in FIGS. 1 and 2, the first printed trace 122, 222 may rather be arranged on the semiconductor carrier 120, 220 itself. For instance, the first printed trace 122, 222 may be arranged to run across the same surface as the one supporting the attached laser component 130, 230.

As is also illustrated in FIG. 2, the electric signal conductor may further comprise a second printed trace 212. It is noted that FIG. 1 does not show the entire device 100, why the second printed trace is not shown in FIG. 1. Such a second printed trace 212 may then also not be arranged on the laser component 230, but rather be arranged on the driver circuit 210. In particular, the second printed trace may be arranged on a PCB (Printed Circuit Board) on which the driver is also arranged, forming said driver circuit 210.

In relation to the electric signal propagation direction from the driver terminal 211 to the laser terminal 131, 231, the second printed trace 212 is arranged upstream in relation to the first printed trace 122, 222, which is arranged downstream.

According to some embodiments, the first printed trace 122, 222 comprises a first trace elongated section 124, 224 and a first trace downstream terminal section 125, 225. The first printed trace 122, 222 may also comprise a first trace upstream terminal section 123, 223. The terms "upstream" and "downstream" have the same meaning as above, and relate to the main electric signal propagation direction. The first trace elongated section 124, 224 then runs between the first trace upstream terminal section 123, 223 and the first trace downstream terminal section 125, 225.

Correspondingly to the first printed trace 122, 222, the second printed trace 212 may comprise a second elongated section 214, running from the driver terminal 211 to a second trace downstream terminal section 215.

All printed traces 122, 132, 212, 222, 232 (the latter being an internal conductor in the laser component 230) may be conventional printed RF traces, such as so-called "microstrips", or any other suitable printed electric conductor.

Further in accordance with some embodiments, the electric signal conductor comprises a first wire bond 141, 241, connecting the first trace downstream terminal 125, 225 to the laser terminal 131, 231.

Correspondingly, the electric signal conductor may also comprise a second wire bond 240, connecting the second trace downstream terminal 215 to the first printed trace 122, 222, such as the first trace upstream terminal 123, 223.

In the Figures, the wire bonds 141, 240, 241 comprise three different and separate, parallel, conductors, namely two ground conductors (on either side) and one signal feed connector (middle). The ground conductors may be used as a signal return path. Whenever the term "wire bond" is used herein, this refers to the signal-carrying feeding wire bond (the respective middle wire bond conductor in the Figures) unless stated otherwise. The carrier 120 may also comprise ground electrodes 126.

Figure 3:
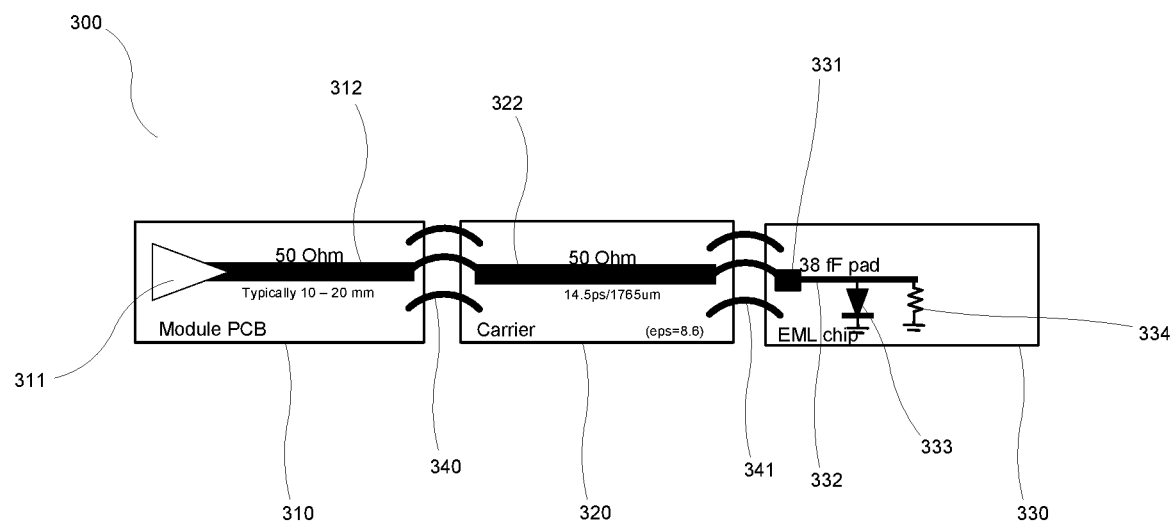
FIG. 3 is a schematic view of a prior art solution.

FIG. 3 illustrates a prior art CoC solution, in which a laser component 330 is arranged on a semiconductor carrier 320 in turn connected to a driver circuit 310. Similarly, to the electric signal conductor in FIGS. 1 and 2 comprising first 122, 222 and second 212 printed traces as well as first 141, 241 and second 240 wire bonds, the electric signal conductor illustrated in FIG. 3 comprises first 322 and second 312 printed traces and first 341 and second 340 wire bonds. The laser 330 has an internal resistance 334 and an internal capacitance 333, as well as an internal conductor 332.

However, in contrast to the solution illustrated in FIG. 3, the terminal sections 123, 125, 215, 223, 225 are arranged as electrically distinct parts in relation to the elongated sections 124, 214, 224. In particular, the impedance, in particular impedance per conducting length unit in the main electric signal propagation direction, of such terminal section 123, 125, 215, 223, 225 is different, and preferably smaller, as compared to a corresponding impedance of said corresponding elongated section 124, 214, 224. For instance, each such terminal section 123, 125, 215, 223, 225 may have a width and/or height, perpendicularly to a main conducting direction, which is different, such as larger, than that of an adjacent elongated section 124, 214, 224. As a further example, a terminal section 123, 125, 215, 223, 225 may be arranged closer to a ground conductor than a corresponding elongated section 124, 214, 224, leading to increased coupling and therefore decreased impedance. For instance, in FIG. 1, the first trace downstream terminal section 125 is not as wide as the first trace upstream terminal section 123, but arranged closer to the ground conductor, resulting in an impedance of 35 Ohm for both respective terminal sections 123, 125.

In particular, according to some embodiments, the first trace elongated section 124, 224 is adapted to the properties of the laser component 130, 230 such that the first trace elongated section 124, 224 and an internal capacitance 233 of the laser component 130, 230 together correspond to an impedance which is at the most 20% from an output impedance of the driver circuit 210, and in particular at the most 20% from an output impedance of the driver terminal 211 of the driver circuit 210. Preferably, this is at least true for the used RF modulation wavelength interval for modulating the laser 130, 230.

Herein, that a number of components "correspond to" a particular impedance is intended to mean that, if one connects said components directly to each other in the same order as in the device 100, 200, the total impedance of the combined, interconnected components would be said impedance. Hence, the combined impedance is in this sense equivalent to the compared impedance.

The present inventors have discovered that this particular relation between the impedance properties of first trace elongated section 124, the laser 130, 230 internal capacitance 233 and the driver circuit 210 terminal 211 output impedance yields very low electric signal distortion even for wire bonds 141, 241 of conventional (large) size and length. This, in turn, achieves a low-noise output light signal from the laser 130, 230.

Figure 4:
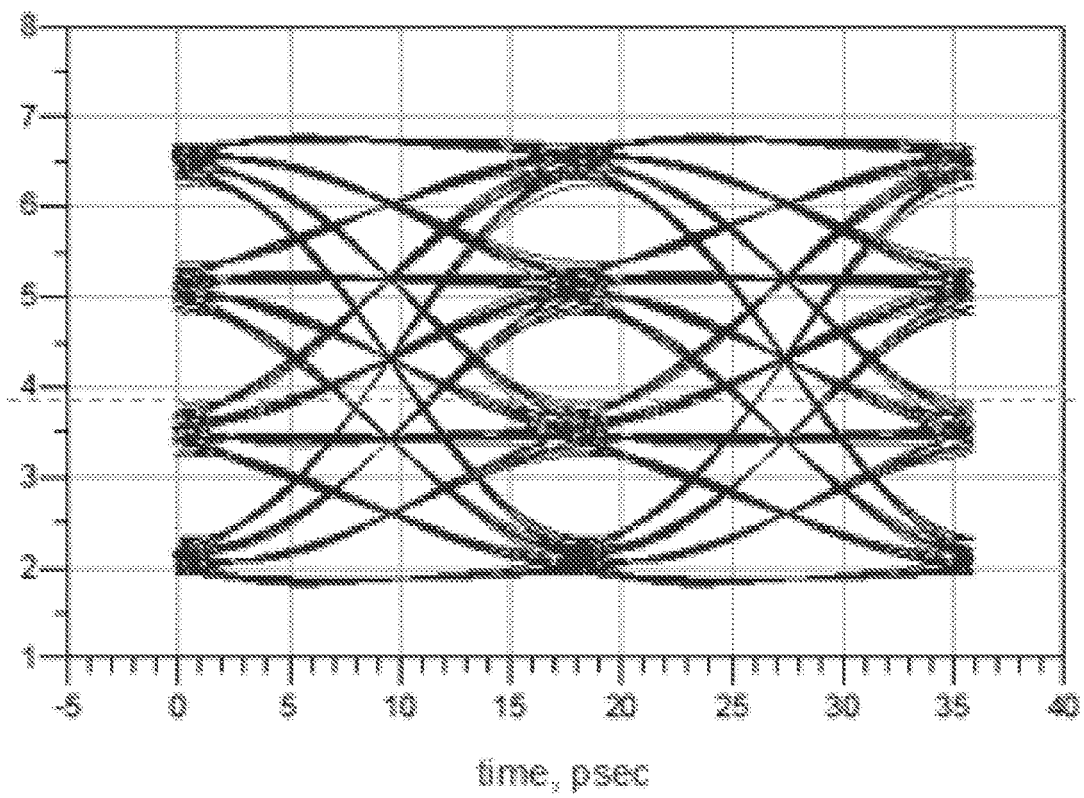
FIG. 4 is an eye diagram illustrating a simulation using the embodiment illustrated in FIG. 2.
Figure 5:
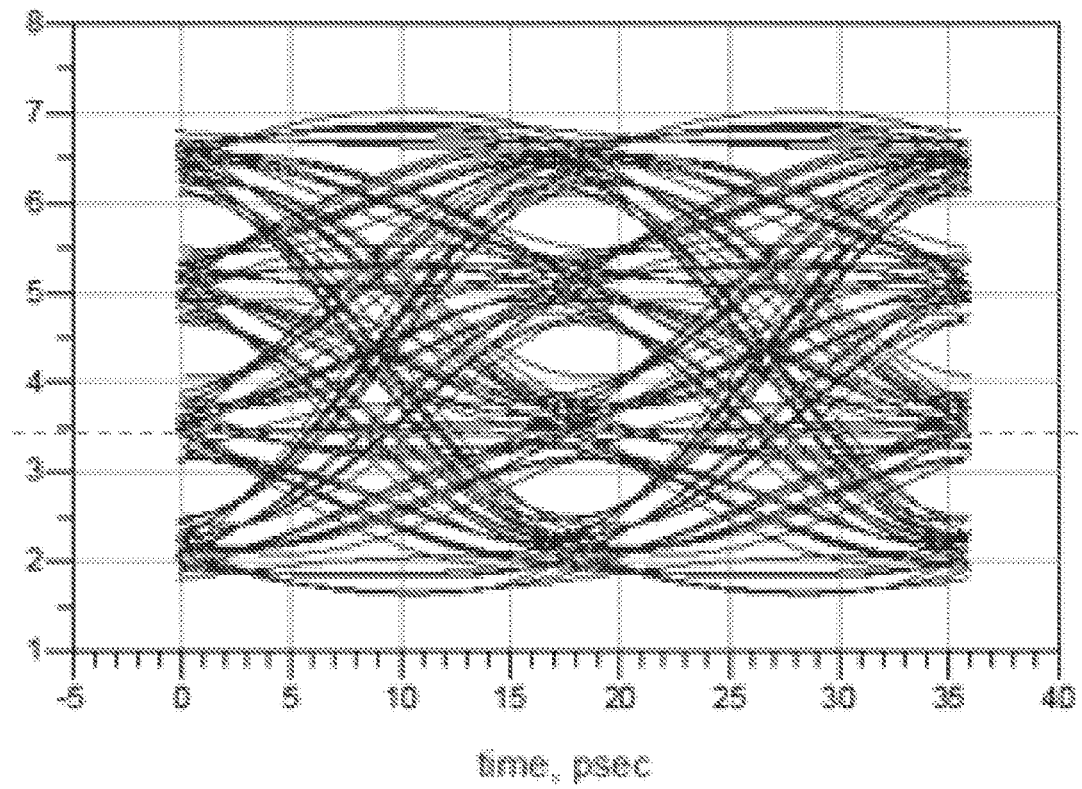
FIG. 5 is an eye diagram illustrating a simulation using the prior art embodiment illustrated in FIG. 3.

These advantages become clear when comparing FIG. 4, showing an eye diagram resulting from a simulation of the inventive setup of FIG. 2, to FIG. 5, showing the corresponding eye diagram for the prior art setup of FIG. 3.

Many different designs are possible, provided the relation is respected. For instance, the driver may be arranged in various configurations, such as mounted on the carrier 120, 220 (hence not using the separate driver circuit 210 and wire bonds 240). The driver may even be directly connected to the laser component 130, 230, not using the carrier 120, 220 at all.

In the latter case, the first electric trace 122, 222 may hence connect the driver terminal 211 to the laser terminal 131, 231, via wire bonds 141, 241.

In the following, however, the preferred example illustrated in FIGS. 1 and 2 will be explained in closer detail.

In a particularly preferred embodiment, the first trace downstream terminal section 125, 225, the first wire bond 141, 241 and the laser terminal 131, 231 together correspond to an impedance which is also at the most 20% from said output impedance of the driver circuit 210, and in particular to the terminal 211. In this case, the driver may for instance either be mounted on the carrier 220 or be arranged as a part of a separate driver circuit 210 component as illustrated in the FIGS. 1 and 2.

In a further particularly preferred embodiment, the second trace downstream terminal section 215, the second wire bond 240 and first trace upstream terminal section 123, 223 together correspond to an impedance which is also at the most 20% from said output impedance of the driver terminal 211. In this case, the driver circuit 210 may be arranged as a separate component, as is illustrated in FIGS. 1 and 2.

In both of these particularly preferred embodiments, that the impedance "corresponds to" an impedance has the same meaning as above.

Hence, in one embodiment the following three combinations of components all correspond to the output impedance of the driver terminal 211:
  the first trace elongated section 124, 224 and the internal capacitance 233 of the laser component 130;
  the first trace downstream terminal section 125, 225, the first wire bond 141, 241 and the laser terminal 131, 231; and
  the second trace downstream terminal section 215, the second wire bond 240 and first trace upstream terminal section 123, 223.

In all these three alternatives (regarding corresponding impedances), the respective impedances may correspond as closely as up to 10% from the output impedance of the driver terminal 211, or even substantially completely (within manufacturing tolerances) correspond to the output impedance of the driver terminal 211.

Further in all three alternatives, the respective components involved have a total length, in the main electric signal propagation direction, which is less than the AC electric signal wavelength.

The wire bonds 141, 240, 241 themselves preferably each has an impedance which is at the most 20% from, or even substantially the same (within manufacturing tolerances) as, the output impedance of the driver terminal 211. In particular, each wire bond 141, 240, 241 may have an impedance of 50 Ohms±20%, and an inductance of 0.2 nanohenry (nH)±20%. In some applications, however, even longer wire bonds, with larger impedances, may be allowed while still achieving the present advantages.

As is illustrated in FIG. 2, the second trace elongated section 214 may be directly connected to the driver terminal 211.

Regarding the output impedance of the driver terminal 211, this may be between 30-70 Ohms, or even 40-60 Ohms. In particular, these impedances are relevant for lasing applications in which the laser component 130, 230 emits laser light in the conventional 1310 nm wavelength band.

The laser component 130 may advantageously be an EML (Electro-absorption Modulated Laser), a DML (Directly Modulated Laser) or a DFB-MZM (Distributed Feedback Laser which is modulated using a Mach Zehnder Modulator) laser component. EML applications are most preferred, even if the presently described principles offer advantages also in DML and DFB-MZM configurations. The device 100, 200 may advantageously be arranged for datacom applications, for digital optical communication between nodes separated at the most by a distance of up to 20 kilometers (km), preferably between 0.2 and 10 km of optical fibre.

The driver of the driver circuit 210 may be arranged to, via the above described electric driving signal, achieve modulation of the laser light emitted by the laser component 130, 230 at a modulation frequency of at least 50 gigabits per second (Gbps). In particular, the modulation may be a PAM (Pulse Amplitude Modulation) modulation, such as a PAM4 modulation. For instance, the example illustrated in FIGS. 1 and 2 use a PAM4 modulation at 112 Gbps.

The impedance of the first trace downstream terminal section 125, 225, when seen as an isolated component, may advantageously be lower than the output impedance of the driver terminal 211. Further, the impedance of the first trace upstream terminal section 123, 223, is when seen as an isolated component, may advantageously be lower than the output impedance of the driver terminal 211. Also, the impedance of the second trace downstream terminal section 114, 215, when seen as an isolated component, may advantageously be lower than the output impedance of the driver terminal 211. The corresponding may also be true regarding any combination of two, or all three, of the first trace upstream terminal section 123, 223, the first trace upstream terminal section 123, 223 and the second trace downstream terminal section 115, 215, when seen as respective individual components.

Similarly, the impedance of the first trace elongated section 124, 224 may be higher than the output impedance of the driver terminal 211, while the second trace elongated section 214 may be substantially the same (within manufacturing tolerances) as the output impedance of the driver terminal 211, or at least at the most 20% from the output impedance.

Each individual one, or even several or even all, of said terminals 123, 125, 215, 223, 225, and even 131, 231, may be formed as a respective local widening of the respective printed trace conductor 122, 132, 212, 222, 232 in question.

FIG. 2 also specifies preferred values for component lengths (in micrometers (μm)) and signal propagation delay (in picoseconds (ps)). The values provided in FIG. 2 can in general vary about ±20% from the respective given value and still achieve the advantages described herein. Hence, preferably the following is preferred:
  The length of the second elongated section 214 is preferably between 8 and 24 mm. It may have an impedance of 50 Ohms±20%.
  The propagation delay of the second trace downstream terminal section 215 is preferably 1.4 ps±20%, and preferably has a length, in the main electric signal propagation direction, of 242 μm±20%, with a typical dielectric constant (eps) equal to 3.6. It may have an impedance of 32 Ohms±20%.
  The propagation delay of the first trace upstream terminal section 123, 223 is preferably 2.9 ps±20%, and preferably has a length, in the main electric signal propagation direction, of 338 μm±20%. It may have an impedance of 35 Ohms±20%.

The propagation delay of the first elongated section 124, 224 is preferably 8.7 ps±20%, and preferably has a length, in the main electric signal propagation direction, of 1095 μm±20%. It may have an impedance of 68 Ohms±20%.

The propagation delay of the first trace downstream terminal section 125, 225 is preferably 2.9 ps±20%, and preferably has a length, in the main signal propagation direction, of 332 μm±20%. It may have an impedance of 35 Ohms±20%.

Furthermore in FIG. 2, it is illustrated that the laser terminal 131, 231 has a capacitance of 38 femtofarads (fF), again±20%. Similarly, the laser component 130, 230 may have an internal resistance of 50 Ohms±20% and an internal capacitance 233 of 180 fF±20%.

Above, preferred embodiments have been described. However, it is apparent to the skilled person that many modifications can be made to the disclosed embodiments without departing from the basic idea of the invention.

For instance, the examples described above have all used 50 Ohms driver circuit 210 output impedance as a starting point for the determination of the other impedances discussed.

However, in case a different driver circuit 210 impedance is used, the other impedances would also shift correspondingly, in a substantial linear fashion. In other words, in the general case the relative impedances, in relation to the driver circuit 210 output impedance, is what is important. This output impedance may, in turn, be shifted to match various internal capacitances 233 of the laser component 130, 230.

In general, all which has been said in relation to the embodiment shown in FIG. 1 is equally applicable to the embodiment shown in FIG. 2, and vice versa.

Hence, the invention is not limited to the described embodiments, but can be varied within the scope of the enclosed claims.

What is claimed is:

1. A semiconductor laser chip-on-carrier (CoC) device comprising:
    a semiconductor laser component arranged in the form of a laser chip mounted on a semiconductor carrier, the semiconductor laser component comprising an electric laser terminal;
    a driver circuit for producing on an electric driver terminal an alternating current electric driving signal, the electric driver terminal having an output impedance; and
    an electric signal conductor electrically connecting the electric driver terminal to the electric laser terminal, wherein the electric signal conductor comprises:
        a first printed trace, which first printed trace is not arranged on the semiconductor laser component and which first printed trace comprises a first trace elongated section and a first trace downstream terminal section; and
        a first wire bond, connecting the first trace downstream terminal section to the electric laser terminal, and
    wherein the first trace elongated section is adapted to the semiconductor laser component such that the first trace elongated section and an internal capacitance of the semiconductor laser component together correspond to an input impedance which is at most 20% from the output impedance of the electric driver terminal of the driver circuit.

2. The semiconductor laser CoC device according to claim 1, wherein the first trace downstream terminal section, the first wire bond and the electric laser terminal together correspond to a first impedance which is also at most 20% from the output impedance of the electric driver terminal of the driver circuit.

3. The semiconductor laser CoC device according to claim 2, wherein the first printed trace is arranged on the semiconductor carrier.

4. The semiconductor laser CoC device according to claim 1, wherein the first printed trace further comprises:
    an upstream first trace upstream terminal section,
    wherein the electric signal conductor further comprises a second printed trace, which second printed trace is also not arranged on the semiconductor laser component and which second printed trace comprises a second trace elongated section and a second trace downstream terminal section; and a second wire bond, connecting the second trace downstream terminal section to the first trace upstream terminal section, and
    wherein the second trace downstream terminal section, the second wire bond and first trace upstream terminal section together correspond to a second impedance which is also at most 20% from the output impedance of the electric driver terminal of the driver circuit.

5. The semiconductor laser CoC device according to claim 4, wherein the second printed trace is arranged on a Printed Circuit Board (PCB) on which the driver circuit is also arranged.

6. The semiconductor laser CoC device according to claim 4, wherein the second trace elongated section is directly connected to the electric driver terminal.

7. The semiconductor laser CoC device according to claim 1, wherein the output impedance of the electric driver terminal of the driver circuit is 50 Ohms+/−20%.

8. The semiconductor laser CoC device according to claim 1, wherein a first impedance of the first trace downstream terminal section is lower than the output impedance of the electric driver terminal of the driver circuit.

9. The semiconductor laser CoC device according to claim 1, wherein a first impedance of the first trace elongated section is higher than the output impedance of the electric driver terminal of the driver circuit.

10. The semiconductor laser CoC device according to claim 1, wherein first trace downstream terminal section is formed as a local widening of the first printed trace.

11. The semiconductor laser CoC device according to claim 1, wherein the semiconductor laser component is arranged to emit 1310 nm laser light.

12. The semiconductor laser CoC device according to claim 1, wherein the semiconductor laser component is an Electro-absorption Modulated Laser (EML), a Directly Modulated Laser (DML) or a Distributed Feedback Laser which is modulated using a Mach Zehnder Modulator (DFB-MZM) laser component.

13. The semiconductor laser CoC device according to claim 1, wherein the driver circuit is arranged to, via said driving signal, achieve modulation of laser light emitted by the semiconductor laser component at a modulation frequency of at least 50 gigabits per second (Gbps).

14. The semiconductor laser CoC device according to claim 13, wherein the modulation is a Pulse Amplitude Modulation (PAM) modulation.

15. The semiconductor laser CoC device according to claim 14, wherein the PAM modulation is a PAM4 modulation.

16. The semiconductor laser CoC device according to claim 1, wherein a combined impedance of the first trace elongated section and the semiconductor laser component is at most 20% from the output impedance of the electric driver terminal of the driver circuit.

* * * * *